United States Patent
Chen et al.

(10) Patent No.: US 12,230,736 B2
(45) Date of Patent: Feb. 18, 2025

(54) SEMICONDUCTOR LIGHT-EMITTING DEVICE AND SEMICONDUCTOR LIGHT-EMITTING COMPONENT

(71) Applicant: EPISTAR CORPORATION, Hsinchu (TW)

(72) Inventors: Jian-Zhi Chen, Hsinchu (TW); Yen-Chun Tseng, Hsinchu (TW); Hui-Fang Kao, Hsinchu (TW); Yao-Ning Chan, Hsinchu (TW); Yi-Tang Lai, Hsinchu (TW); Yun-Chung Chou, Hsinchu (TW); Shih-Chang Lee, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 402 days.

(21) Appl. No.: 17/211,331

(22) Filed: Mar. 24, 2021

(65) Prior Publication Data
US 2021/0305456 A1    Sep. 30, 2021

(30) Foreign Application Priority Data
Mar. 24, 2020  (TW) .................................. 109109785

(51) Int. Cl.
*H01L 33/38* (2010.01)
*H01L 25/075* (2006.01)
(Continued)

(52) U.S. Cl.
CPC .......... *H01L 33/36* (2013.01); *H01L 25/0753* (2013.01); *H01L 33/20* (2013.01);
(Continued)

(58) Field of Classification Search
CPC ..... H01L 25/0753; H01L 33/20; H01L 33/30; H01L 33/32; H01L 33/36; H01L 33/38; H01L 33/385; H01L 33/46; H01L 33/62
See application file for complete search history.

(56) References Cited

U.S. PATENT DOCUMENTS

| 10,361,342 B2 | 7/2019 | Chen et al. |
| 2006/0071219 A1* | 4/2006 | Wojnarowski .......... H01L 33/20 |
| | | 257/79 |

(Continued)

FOREIGN PATENT DOCUMENTS

| CN | 101488539 A | 7/2009 |
| CN | 108206227 A | 6/2018 |

(Continued)

*Primary Examiner* — Matthew C Landau
*Assistant Examiner* — Dmitriy Yemelyanov
(74) *Attorney, Agent, or Firm* — Muncy, Geissler, Olds & Lowe, P.C.

(57) ABSTRACT

The present disclosure provides a semiconductor light-emitting device and a semiconductor light-emitting component. The semiconductor light-emitting device includes a substrate, a first semiconductor contact layer, a semiconductor light-emitting stack including an active layer, a first-conductivity-type contact structure, a second semiconductor contact layer, a second-conductivity-type contact structure and a first electrode pad. The first-conductivity-type contact structure is electrically connected to the first semiconductor contact layer. The second-conductivity-type contact structure is electrically connected to the second semiconductor contact layer. The first-conductivity-type contact structure has a first bottom surface and a first top surface, and the active layer has a second bottom surface and a second top surface. The first bottom surface is lower than the second bottom surface, and the first top surface is higher than the second top surface in a cross-sectional view of the semiconductor light-emitting device.

20 Claims, 8 Drawing Sheets

(51) Int. Cl.
  *H01L 33/20* (2010.01)
  *H01L 33/36* (2010.01)
  *H01L 33/30* (2010.01)
  *H01L 33/32* (2010.01)
  *H01L 33/46* (2010.01)
(52) U.S. Cl.
  CPC ............ *H01L 33/385* (2013.01); *H01L 33/30* (2013.01); *H01L 33/32* (2013.01); *H01L 33/46* (2013.01)

(56) References Cited

U.S. PATENT DOCUMENTS

| | | | |
|---|---|---|---|
| 2006/0113638 A1* | 6/2006 | Maaskant | H01L 33/20 |
| | | | 257/E31.038 |
| 2006/0151802 A1* | 7/2006 | Tsuchiya | H01L 21/28575 |
| | | | 257/E33.025 |
| 2007/0262338 A1 | 11/2007 | Higashi | |
| 2010/0148198 A1* | 6/2010 | Sugizaki | H01L 33/62 |
| | | | 257/E33.056 |
| 2012/0080697 A1 | 4/2012 | Chen et al. | |
| 2013/0049053 A1* | 2/2013 | Kususe | H01L 33/38 |
| | | | 257/E33.072 |
| 2013/0320371 A1 | 12/2013 | Sugizaki | |
| 2014/0103376 A1* | 4/2014 | Ou | H01L 33/22 |
| | | | 257/95 |
| 2014/0246648 A1* | 9/2014 | Im | H01L 33/382 |
| | | | 257/13 |
| 2015/0060924 A1* | 3/2015 | Lin | H01L 33/42 |
| | | | 257/98 |
| 2016/0126422 A1 | 5/2016 | Jeon | |
| 2017/0373226 A1* | 12/2017 | Chen | H01L 33/405 |
| 2018/0090539 A1* | 3/2018 | Son | H01L 33/405 |
| 2020/0006612 A1 | 1/2020 | Lee | |

FOREIGN PATENT DOCUMENTS

| | | |
|---|---|---|
| CN | 110739376 A | 1/2020 |
| JP | 2017054976 A | 3/2017 |
| TW | 531902 B | 5/2003 |

* cited by examiner

SEMICONDUCTOR LIGHT-EMITTING DEVICE AND SEMICONDUCTOR LIGHT-EMITTING COMPONENT

CROSS REFERENCE TO RELATED APPLICATIONS

This application claims the right of priority based on TW application Serial No. 109109785, filed on Mar. 24, 2020, which is incorporated by reference herein in its entirety.

FIELD OF DISCLOSURE

The present disclosure relates to a semiconductor light-emitting device and a semiconductor light-emitting component including the same, and in particular to a semiconductor light-emitting device having a contact layer and a semiconductor light-emitting component including the same.

BACKGROUND OF THE DISCLOSURE

Semiconductor optoelectronic materials can be used in production of various optoelectronic semiconductor devices, such as light emitting diodes (LEDs), laser diodes (LDs), or solar cells. With the development of technology, optoelectronic semiconductor devices are widely applied to fields like illumination, medical care, display, communication, sensing, or power supply system. For example, a light emitting diode device has the advantages of low energy consumption and long operating lifetime, and is therefore widely used.

SUMMARY OF THE DISCLOSURE

The present disclosure provides a semiconductor light-emitting device. The semiconductor light-emitting device includes a substrate, a first semiconductor contact layer, a semiconductor light-emitting stack, a first-conductivity-type contact structure, a second semiconductor contact layer, a second-conductivity-type contact structure and a first electrode pad. The substrate has a first upper surface including a first region and a second region. The first semiconductor contact layer is located on the first region and not located on the second region. The first semiconductor contact layer has a second upper surface including a third region and a fourth region. The semiconductor light-emitting stack is located on the third region and not located on the fourth region, and the semiconductor light-emitting stack includes an active layer. The first-conductivity-type contact structure is located on the fourth region and electrically connected to the first semiconductor contact layer. The second semiconductor contact layer is located on the semiconductor light-emitting stack. The second-conductivity-type contact structure is located on the semiconductor light-emitting stack and electrically connected to the second semiconductor contact layer. The first electrode pad is located on and electrically connected to the first-conductivity-type contact structure. The first-conductivity-type contact structure has a first bottom surface and a first top surface, and the active layer has a second bottom surface and a second top surface. The first bottom surface is lower than the second bottom surface, and the first top surface is higher than the second top surface in a cross-sectional view of the semiconductor light-emitting device.

The present disclosure further provides a semiconductor light-emitting component which includes a plurality of semiconductor light-emitting devices and a carrier. The carrier includes a plurality of electrode pads electrically connected to a first electrode pad and a second electrode pad of each semiconductor light-emitting device.

DETAILED DESCRIPTION OF THE DISCLOSURE

Figure 1A:
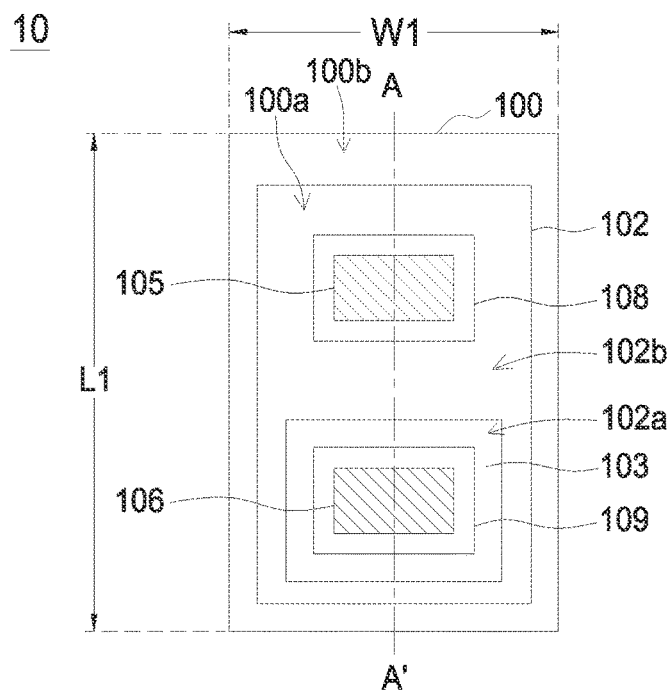
FIG. 1A to FIG. 1B show schematic views of a semiconductor light-emitting device in accordance with an embodiment of the present disclosure.

The following embodiments will be described with accompany drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art.

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Furthermore, in the present disclosure, a description of "a layer/structure only includes M material" means the M material is the main constituent of the layer/structure; however, the layer/structure may still contain a dopant or unavoidable impurities.

Figure 1B:
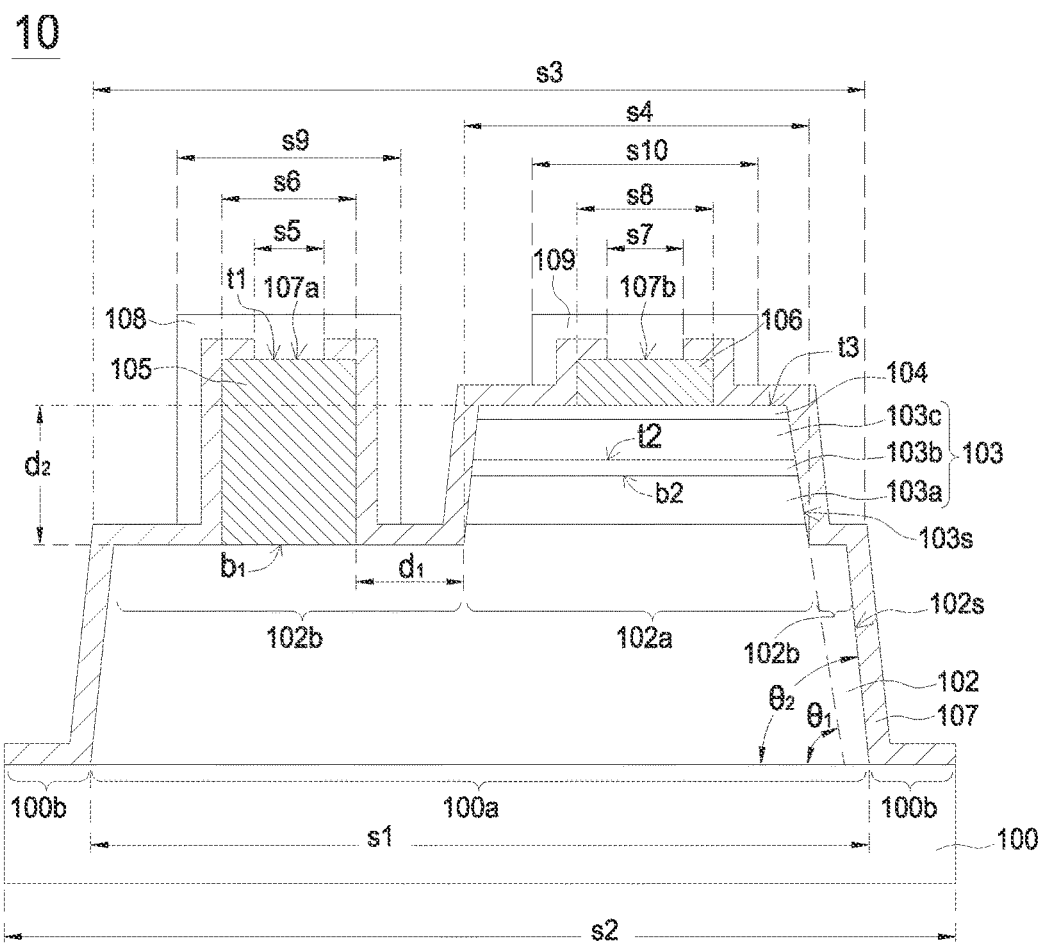

FIG. 1A shows a schematic top view of a semiconductor light-emitting device 10 in accordance with an embodiment of the present disclosure, and FIG. 1B shows a schematic sectional view along A-A' line in FIG. 1A. The semiconductor light-emitting device 10 includes a base 100, a first semiconductor contact layer 102, a semiconductor light-emitting stack 103, a second semiconductor contact layer 104, a first-conductivity-type contact structure 105, a second-conductivity-type contact structure 106, an electrically insulating layer 107, a first electrode pad 108 and a second electrode pad 109. The first semiconductor contact layer 102 is formed on an upper surface of the base 100. The semiconductor light-emitting stack 103 is formed on an upper surface of the first semiconductor contact layer 102. The second semiconductor contact layer 104 is formed on the semiconductor light-emitting stack 103. The first-conductivity-type contact structure 105 is formed on the first semiconductor contact layer 102 and is electrically connected to the first semiconductor contact layer 102. The second-conductivity-type contact structure 106 is formed on the second semiconductor contact layer 104 and is electrically connected to the second semiconductor contact layer 104. The electrically insulating layer 107 covers on the base 100, the first semiconductor contact layer 102, the semiconductor light-emitting stack 103, the second semiconductor contact layer 104, the first-conductivity-type contact structure 105 and the second-conductivity-type contact structure 106. The electrically insulating layer 107 may have a first opening 107a and a second opening 107b through which a portion of an upper surface of the first-conductivity-type contact structure 105 and a portion of an upper surface of the second-conductivity-type contact structure 106 are respectively exposed. The first electrode pad 108 electrically connects the first-conductivity-type contact structure 105 through the first opening 107a. The second electrode pad 109 electrically connects the second-conductivity-type contact structure 106 through the second opening 107b. As shown in FIG. 1B, the first electrode pad 108 is not overlapped with the semiconductor active layer 103b in a vertical direction, that is, the semiconductor active layer 103b is not located under the first electrode pad 108. The second electrode pad 109 is overlapped with the semiconductor active layer 103b, that is, the semiconductor active layer 103b is located under the second electrode pad 109.

The upper surface of the base 100 includes a first region 100a and a second region 100b. The first region 100a is adjacent to the second region 100b. The first semiconductor contact layer 102 is formed on the first region 100a and the second region 100b is not covered by the first semiconductor contact layer 102. As shown in FIG. 1A, the second region 100b surrounds the first region 100a. As shown in FIG. 1B, the base 100 has a second width s2 larger than a first width s1 of the first semiconductor contact layer 102. The electrically insulating layer 107 covers the second region 100b. In an embodiment, the electrically insulating layer 107 covers on the second region 100b and physically contacts the base 100. The upper surface of the first semiconductor contact layer 102 includes a third region 102a and a fourth region 102b. The third region 102a is adjacent to the fourth region 102b. The semiconductor light-emitting stack 103 is formed on the third region 102a, and the fourth region 102b is not covered by the semiconductor light-emitting stack 103. As shown in FIG. 1A, the fourth region 102b surrounds the third region 102a. As shown in FIG. 1B, the first semiconductor contact layer 102 has a third width s3 larger than a fourth width s4 of the semiconductor light-emitting stack 103. The first-conductivity-type contact structure 105 is formed on the fourth region 102b and is electrically connected to the first semiconductor contact layer 102. In an embodiment, first-conductivity-type contact structure 105 covers the fourth region 102b and physically contacts the first semiconductor contact layer 102. As shown in FIG. 1B, the first-conductivity-type contact structure 105 is separated from the semiconductor light-emitting stack 103 with a horizontal distance $d_1$. In an embodiment, the horizontal distance $d_1$ is not less than 1 μm. For example, the horizontal distance $d_1$ is between 3 μm and 10 μm (both included). When the horizontal distance $d_1$ is less than 1 μm, the first-conductivity-type contact structure 105 and the semiconductor light-emitting stack 103 may be too close so that a short circuit may occur during operation of the semiconductor light-emitting device 10.

In the embodiment, the first semiconductor contact layer 102 has an outer side wall 102s, and the semiconductor light-emitting stack 103 has an outer side wall 103s. As shown in FIG. 1B, an extension line extending from the outer side wall 103s of the semiconductor light-emitting stack 103 and an extension line extending from an upper surface of the base 100 form a first acute angle $\theta_1$; an extension line extending from the outer side wall 102s of the first semiconductor contact layer 102 and an extension line extending from the upper surface of the base 100 form a second acute angle $\theta_2$. In an embodiment, the second acute angle $\theta_2$ is larger than the first acute angle $\theta_1$. In another embodiment, the second acute angle $\theta_2$ is equal to the first acute angle $\theta_1$. In an embodiment, the first acute angle $\theta_1$ is within a range of larger than or equal to 55° and less than or equal to 75°, thereby it is much easier for the electrically insulating layer 107 to cover the outer side wall 103s of the semiconductor light-emitting stack 103. In an embodiment, the second acute angle $\theta_2$ is within a range of larger than or equal to 75° and less than or equal to 90°. In an embodiment, the semiconductor light-emitting device 10 is a light-emitting diode (LED) chip.

The semiconductor light-emitting stack 103 includes a first cladding layer 103a located on the first semiconductor contact layer 102, a semiconductor active layer 103b located on the first cladding layer 103a, and a second cladding layer 103c located on the semiconductor active layer 103b. The first cladding layer 103a has a first conductivity type and the second cladding layer 103c has a second conductivity type different from the first conductivity type. The first cladding layer 103a and the second cladding layer 103c can respectively provide holes or electrons, or electrons or holes to the semiconductor active layer 103b. Thereby the holes and electrons can combine in the semiconductor active layer 103b to emit a light with a specific wavelength. In an embodiment, the first conductivity type is p-type, and the second conductivity type is n-type. In another embodiment, the first conductivity type is n-type, and the second conductivity type is p-type.

In an embodiment, the semiconductor light-emitting device 10 is a micro-LED chip. As shown in FIG. 1A, the semiconductor light-emitting device 10 has a length L1 and a width W1. The length L1 may be less than or equal to 150 μm. For example, the length L1 is between 20 μm and 150 μm (both included). In an embodiment, the length L1 is between 20 μm and 60 μm (both included) or between 60 μm to 150 μm (both included). The width W1 may be less than or equal to 100 μm. For example, the width W1 is between 10 μm and 100 μm (both included). In an embodiment, the width W1 is between 10 μm and 30 μm (both included) or between 30 μm and 75 μm (both included). In an embodiment, a ratio of the width W1 and the length L1 (i.e., W1/L1) is between 0.2 and 0.8 (both included).

In an embodiment, as shown in FIG. 1B, the first-conductivity-type contact structure 105 is a single layer. For example, material compositions of the first-conductivity-type contact structure 105 are uniformly distributed in first-conductivity-type contact structure 105. A first bottom surface b1 of the first-conductivity-type contact structure 105 is lower than a second bottom surface b2 of the semiconductor active layer 103b, and a first top surface t1 of the first-conductivity-type contact structure 105 is higher than a second top surface t2 of the semiconductor active layer 103b. In an embodiment, the first top surface t1 of the first-conductivity-type contact structure 105 is higher than a third top surface t3 of the second semiconductor contact layer 104. In an embodiment, a height difference between the first-conductivity-type contact structure 105 and the second-conductivity-type contact structure 106 is less than or equal to 10% of the height of the first-conductivity-type contact structure 105. For example, the height difference is between 0% and 10% (both included) of the height of the first-conductivity-type contact structure 105. The height mentioned above is defined by a vertical distance from the upper surface of the base 100 to an upper surface of the structure (e.g. the first-conductivity-type contact structure 105). In another embodiment, the first-conductivity-type contact structure 105 includes multiple layers, in which an apparent interface is present between any two layers or adjacent layers has different materials. When the first-conductivity-type contact structure 105 includes multiple layers, the upper surface of the first-conductivity-type contact structure 105 is defined as an upper surface of an uppermost surface of the first-conductivity-type contact structure 105. In an embodiment, the first-conductivity-type contact structure 105 physically contacts the first semiconductor contact layer 102, and the second-conductivity-type contact structure 106 physically contacts the second semiconductor contact layer 104. In an embodiment, an extension line extending from a contact surface between the first-conductivity-type contact structure 105 and the first semiconductor contact layer 102 to an extension line extending from a contact surface between the second-conductivity-type contact structure 106 and the second semiconductor contact layer 104 has a vertical distance d2 less than or equal to 10 μm. For example, the vertical distance d2 is between 3 μm and 8 μm (both included). In an embodiment, the vertical distance d2 is between 4.5 μm and 6 μm (both included).

In an embodiment, the electrically insulating layer 107 continuously covers the first-conductivity-type contact structure 105, the second-conductivity-type contact structure 104, the semiconductor light-emitting stack 103 and the first semiconductor contact layer 102, and extends to the upper surface of the base 100. The first electrode pad 108 fills in the first opening 107a to contact the first-conductivity-type contact structure 105, and the first electrode pad 108 extends and cover an upper surface and a side surface of the electrically insulating layer 107 which is located on the fourth region 102b. As shown in FIG. 1A, a projection region of the first-conductivity-type contact structure 105 on the base 100 is completely within a projection region of the first electrode pad 108 on the base 100 in the top view. As shown in FIG. 1B, the second electrode pad 109 fills in the second opening 107b to contact the second-conductivity-type contact structure 106, and the second electrode pad 109 extends and covers the upper surface of the electrically insulating layer 107 which is located on the third region 102a. As shown in FIG. 1A, in the top view, a projection region of the second-conductivity-type contact structure 106 on the base 100 is completely within a projection region of the second electrode pad 109 on the base 100 in the top view. As shown in FIG. 1B, the first opening 107a has a fifth width s5 less than a sixth width s6 of the first-conductivity-type contact structure 105. The second opening 107b has a seventh width s7 less than an eighth width s8 of the second-conductivity-type contact structure 106. In an embodiment, projection areas of the first electrode pad 108 and the second electrode pad 109 on the base 100 are substantially the same (as shown in FIG. 1A). In an embodiment, a height difference between the first electrode pad 108 and the second electrode pad 109 is less than or equal to 10% of the height of the first electrode pad 108. For example, the height difference is between 0% and 10% (both included). The height mentioned above is defined by a vertical distance from the upper surface of the base 100 to an upper surface of the structure (e.g. the first electrode pad 108 or the second electrode pad 109). In an embodiment, the height difference between the first electrode pad 108 and the second electrode pad 109 is less than 1 μm. The first electrode pad 108 and the second electrode pad 109 can serve as a bonding pad for connecting to an outer circuit (not shown). In addition, as shown in the top view of FIG. 1B, a ninth width s9 of the first electrode pad 108 and/or a tenth width s10 of the second electrode pad 109 may be less than the fourth width s4 of the semiconductor light-emitting stack 103. In some embodiments, the ninth width s9 of the first electrode pad 108 and/or the tenth width s10 of the second electrode pad 109 may be larger than the fourth width s4 of the semiconductor light-emitting stack 103 in the top view.

In an embodiment, the base 100 is an epitaxial substrate, and the first semiconductor contact layer 102 and the semiconductor light-emitting stack 103 may be epitaxially formed on the base 100 by metal organic chemical vapor deposition (MOCVD). In an embodiment, the light emitted from the semiconductor active layer 103b mainly transmits towards the electrically insulating layer 107. That is, a main light emitting surface of the semiconductor light-emitting device 10 is the upper surface of the electrically insulating layer 107. A material of the base 100 may be transparent or opaque to the light emitted from the semiconductor active layer 103b. In another embodiment, the light emitted from the semiconductor active layer 103b mainly transmits towards a back surface of the base 100. That is, main light emitting surface of the semiconductor light-emitting device 10 is the back surface of the base 100 and the material of the base 100 is transparent to the light emitted from the semiconductor active layer 103b. The base 100 includes a conductive material or an insulating material. The conductive material includes gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material includes sapphire. The base 100 may have a rectangular shape in the top view.

In an embodiment, the first semiconductor contact layer 102, the first cladding layer 103a, the semiconductor active layer 103b, the second cladding layer 103c, the second semiconductor contact layer 104 include same series of group III-V semiconductor material, such as AlInGaAs series, AlGaInP series or AlInGaN series. The AlInGaAs series represents $(Al_{x1}In_{(1-x1)})_{1-x2}Ga_{x2}As$, the AlInGaP series represents $(Al_{x1}In_{(1-x1)})_{1-x2}Ga_{x2}P$, the AlInGaN series represents $(Al_{x1}In_{(1-x1)})_{1-x2}Ga_{x2}N$, wherein $0 \le x_1 \le 1$, and $0 \le x_2 \le 1$. The wavelength of the light emitted is determined by the material composition of the semiconductor active layer 103b. For example, the material of the semiconductor active layer 103b may include AlGaInP series, InGaN series, or AlGaN series, and the semiconductor light-emitting device 10 can emit an infrared light with a peak wavelength of 700 nm to 1700 nm, a red light with a peak wavelength of 610 nm to 700 nm, a yellow light with a peak wavelength of 530 nm to 570 nm, a blue light or a deep blue light with a peak wavelength of 400 nm to 490 nm, a green light with a peak wavelength of 490 nm to 550 nm, or an ultraviolet light with a peak wavelength of 250 nm to 400 nm. In an embodiment, the material of the semiconductor active layer 103b includes a compound semiconductor such as $(Al_{x1}In_{(1-x1)})_{1-x2}Ga_{x2}P$ (wherein 0<x1≤1, 0<x2≤1), and the first cladding layer 103a may include $Al_{x3}In_{1-x3}P$ (wherein 0<x3<1), and the second cladding layer 103c may include $Al_{x4}In_{1-x4}P$ (wherein 0<x4<1). The first semiconductor contact layer 102 and the second semiconductor contact layer 104 have different conductivity type. In an embodiment, the first semiconductor contact layer 102 is p-type, the second semiconductor contact layer 104 is n-type. The first semiconductor contact layer 102 and the second semiconductor contact layer 104 may respectively include a binary compound semiconductor or a ternary compound semiconductor. In an embodiment, the first semiconductor contact layer 102 includes GaP, and the second semiconductor contact layer 104 includes $In_{x5}Ga_{1-x5}P$ (wherein 0<x5<1) or GaAs.

The first-conductivity-type contact structure 105 and the second-conductivity-type contact structure 106 may respectively include a conductive material, such as metal or alloy. In an embodiment, the first-conductivity-type contact structure 105 and/or the second-conductivity-type contact structure 106 only includes metal or alloy. The materials of the first-conductivity-type contact structure 105 and the second-conductivity-type contact structure 106 may be respectively selected based on the materials of the first semiconductor contact layer 102 and second semiconductor contact layer 104, so that the first-conductivity-type contact structure 105 and the second-conductivity-type contact structure 106 form better electrical contacts (such as ohmic contacts) with the first semiconductor contact layer 102 and the second semiconductor contact layer 104, respectively. The metal may be Ge, Be, Zn, Au, Ni or Cu. The alloy may include two or more metals selected from the above-mentioned metals. The alloy may be GeAuNi, BeAu, GeAu, or ZnAu. In an embodiment, the first-conductivity-type contact structure 105 includes BeAu, and the second-conductivity-type contact structure 106 includes GeAu. In an embodiment, the first electrode pad 108 and the first-conductivity-type contact structure 105 have different material compositions. In an embodiment, the second electrode pad 109 and the second-conductivity-type contact structure 106 have different material compositions. The first electrode pad 108 and the second electrode pad 109 are respectively a single layer or multiple layers. The first electrode pad 108 and the second electrode pad 109 includes one or more material selected from Ni, Ti, Pt, Pd, Ag, Au, Al, Sn and Cu.

The electrically insulating layer 107 may include a dielectric material, such as $TaO_x$, $AlO_x$, $SiO_x$, $TiO_x$, $SiN_x$ or SOG. In an embodiment, the electrically insulating layer 107 includes a reflective structure, such as a distributed Bragg reflector (DBR) structure. The DBR structure may be formed by alternately stacking a plurality of first dielectric layers and a plurality of second dielectric layers, in which the first dielectric layers and the second dielectric layers have different refractive indexes. When the light emitted from the semiconductor light-emitting device 10 is extracted though the base 100, the electrically insulating layer 107 including the reflective structure can help to reflect the light towards the base 100 to exit the semiconductor light-emitting device 10 for increasing the efficiency of the semiconductor light-emitting device 10.

In addition, as shown in FIG. 1A, a top-view area of the semiconductor light-emitting stack 103 is less than a top-view area of the first semiconductor contact layer 102. In an embodiment, the top-view area of the semiconductor light-emitting stack 103 occupies 40% or more of the top-view area of the first semiconductor contact layer 102. In some embodiments, the top-view area of the semiconductor light-emitting stack 103 occupies 90% or less of the top-view area of the first semiconductor contact layer 102. For example, the top-view area of the semiconductor light-emitting stack 103 occupies about 85%, 80%, 75%, 70%, 65%, 60%, 55%, 50% or 45% of the top-view area of the first semiconductor contact layer 102 to fulfill requirements for different light-emitting areas and light-emitting efficiencies.

Figure 2A:
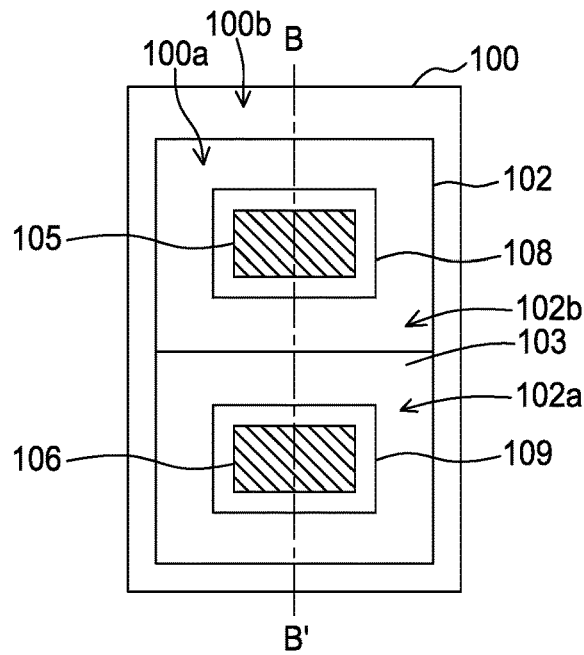
FIG. 2A to FIG. 2B show schematic views of a semiconductor light-emitting device in accordance with an embodiment of the present disclosure.
Figure 2B:
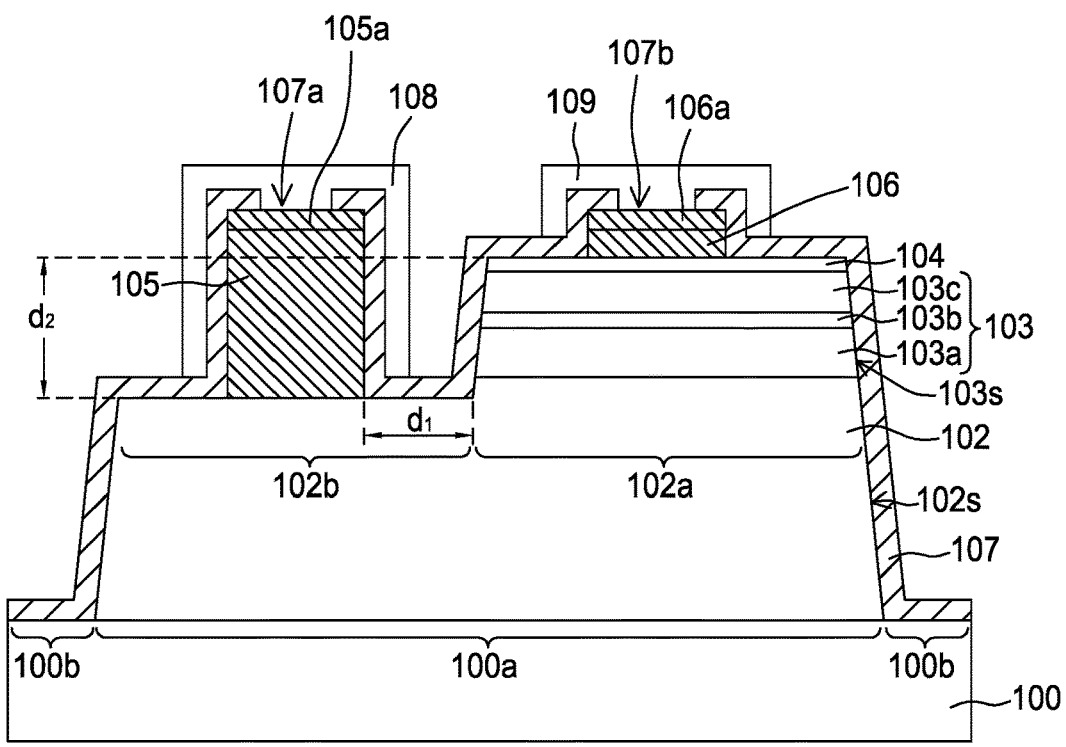

FIG. 2A shows a schematic top view of a semiconductor light-emitting device 20 in accordance with an embodiment of the present disclosure, and FIG. 2B shows a schematic sectional view along B-B' line in FIG. 2A. The semiconductor light-emitting device 20 includes a base 100, a first semiconductor contact layer 102, a semiconductor light-emitting stack 103, a second semiconductor contact layer 104, a first-conductivity-type contact structure 105, a first metal intermediate layer 105a, a second metal intermediate layer 106a, a second-conductivity-type contact structure 106, an electrically insulating layer 107, a first electrode pad 108 and a second electrode pad 109. The semiconductor light-emitting device 20 is mostly the same as the semiconductor light-emitting device 10, wherein elements indicated with same numerals or names are elements having same characteristics or properties, such as material composition or effect. Regarding specific descriptions for the elements, the foregoing embodiments can be referred to and are not repeatedly described herein.

The main different between the semiconductor light-emitting device 20 and the semiconductor light-emitting device 10 is that the fourth region 102b in the semiconductor light-emitting device 20 is adjacent to the third region 102a but the fourth region 102b does not surround the third region 102a. As shown in FIG. 2A, the third region 102a and the fourth region 102b are parallelly arranged along the B-B' section-line. As shown in FIG. 2B, the semiconductor light-emitting stack 103 has an outer side wall 103s which physically connects with an outer side wall 102s of the first semiconductor contact layer 102. That is, there is no fourth region 102b between the outer side wall 103s of the semiconductor light-emitting stack 103 and the outer side wall 102s of the first semiconductor contact layer 102. Slopes of the outer side wall 103s of the semiconductor light-emitting stack 103 and the outer side wall 102s of the first semiconductor contact layer 102 may be the same or different. In an embodiment, an absolute value of the slope of the outer side wall 103s is smaller than an absolute value of the slope of the outer side wall 102s. Another difference between the semiconductor light-emitting device 20 and the semiconductor light-emitting device 10 is that the semiconductor light-emitting device 20 further includes the first metal intermediate layer 105a and the second metal intermediate layer 106a. The first metal intermediate layer 105a is formed on the first-conductivity-type contact structure 105. The second metal intermediate layer 106a is formed on the second-conductivity-type contact structure 106. As shown in FIG. 2B, the first metal intermediate layer 105a may be located between the first-conductivity-type contact structure 105 and the first electrode pad 108, and may be located between the first-conductivity-type contact structure 102 and the electrically insulating layer 107. The second metal intermediate layer 106a may be located between the second-conductivity-type contact structure 106 and the second electrode pad 109, and between the second-conductivity-type contact structure 106 and the electrically insulating layer 107. In the embodiment, the electrically insulating layer 107 is formed on the base 100, the first semiconductor contact layer 102, the semiconductor light-emitting stack 103, the second semiconductor contact layer 104, the first-conductivity-type contact structure 105, the first metal intermediate layer 105a, the second metal intermediate layer 106a, and the second-conductivity-type contact structure 106. In the embodiment, the electrically insulating layer 107 has a first opening 107a through which a portion of the upper surface of the first metal intermediate layer 105a is exposed, and a second opening 107b through which a portion of the upper surface of the second metal intermediate layer 106a is exposed. The first electrode pad 108 electrically connects the first metal intermediate layer 105a through the first opening 107a. The second electrode pad 109 electrically connects the second metal intermediate layer 106a through the second opening 107b. The first metal intermediate layer 105a and the second metal intermediate layer 106a can serve as an etching stop layer to protect the first-conductivity-type contact structure 105 and the second-conductivity-type contact structure 106 from being etched during manufacturing processes so that the electrical characteristics of the first-conductivity-type contact structure 105 and the second-conductivity-type contact structure 106 can be more stable. Specifically, the first metal intermediate layer 105a does not include the same material as the first-conductivity-type contact structure 105 or the second-conductivity-type contact structure 106. The first metal intermediate layer 105a and the second metal intermediate layer 106a may respectively include an etching resistant material. The etching resistant material may include metal, such as titanium (Ti) or platinum (Pt). The semiconductor light-emitting device 20 is, for example, a light emitting diode (LED) chip. For the positions, materials, and related descriptions of other layers or structures, the foregoing embodiments can be referred to and are not repeatedly described herein.

Figure 3:
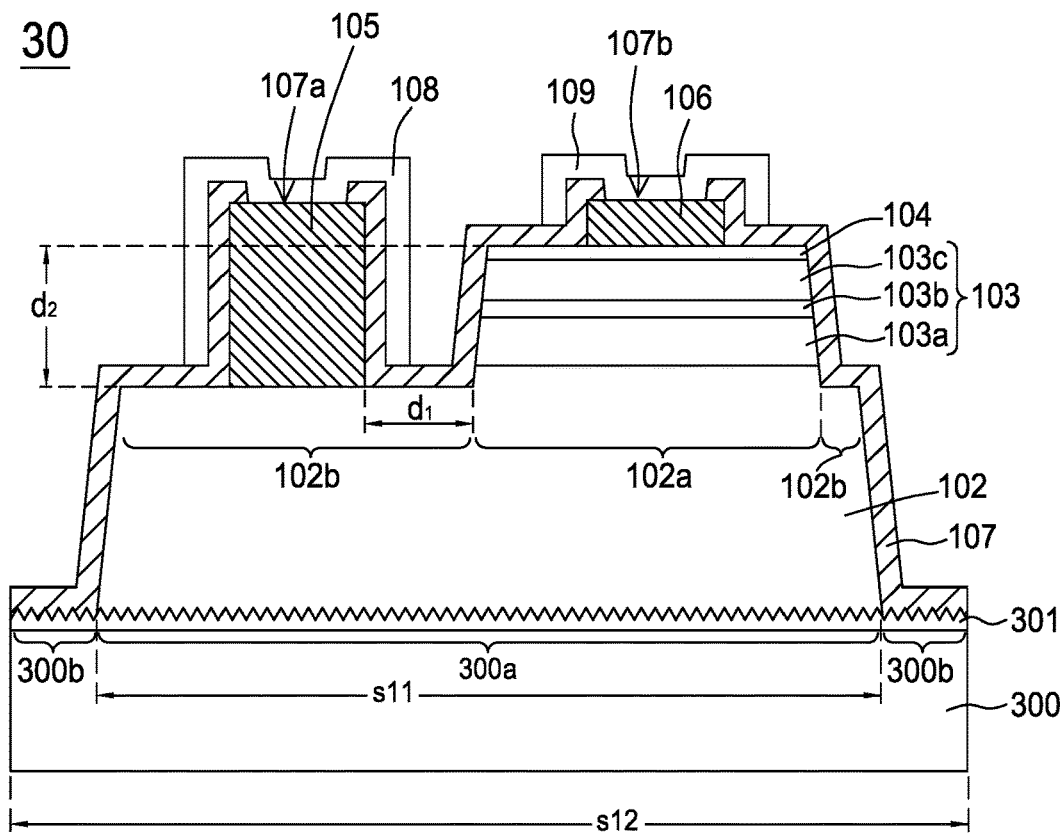
FIG. 3 shows a schematic sectional view of a semiconductor light-emitting device in accordance with an embodiment of the present disclosure.

FIG. 3 shows a semiconductor light-emitting device 30 in accordance with an embodiment of the present disclosure. The semiconductor light-emitting device 30 includes a base 300, an adhesive layer 301, a first semiconductor contact layer 102, a semiconductor light-emitting stack 103, a second semiconductor contact layer 104, a first-conductivity-type contact structure 105, a second-conductivity-type contact structure 106, an electrically insulating layer 107, a first electrode pad 108 and a second electrode pad 109. The semiconductor light-emitting device 30 is mostly the same as the semiconductor light-emitting device 10, wherein elements indicated with same numerals or names are elements having same characteristics or properties, such as material composition or effect. Regarding specific descriptions for the elements, the foregoing embodiments can be referred to and are not repeatedly described herein.

The main difference between the semiconductor light-emitting device 30 and the semiconductor light-emitting device 10 is that the semiconductor light-emitting device 30 further includes an adhesive layer 301 located on the base 300. The adhesive layer 301 is located between the semiconductor light-emitting stack 103 and the base 300 for bonding the semiconductor light-emitting stack 103 to the base 300. In the embodiment, the first semiconductor contact layer 102 is formed on an upper surface of the adhesive layer 301. The electrically insulating layer 107 is formed on the base 300, the adhesive layer 301, the first semiconductor contact layer 102, the semiconductor light-emitting stack 103, the second semiconductor contact layer 104, the first-conductivity-type contact structure 105, and the second-conductivity-type contact structure 106. In the embodiment, the base 300 is a bonding substrate so that there is no specific limitation to the epitaxial characteristics (such as lattice constant) of the base 300; therefore, the material of the bonding substrate can be selected according to application. The material of the bonding substrate may include a high thermal conductivity material, a high light transmission material, or a high reflectivity material, such as $AlO_x$ or $SiO_x$. Specifically, the semiconductor light-emitting stack 103 is first grown on a growth substrate by epitaxial growth, and the adhesive layer 301 is formed on the semiconductor light-emitting stack 103 and/or the base 300, and the semiconductor light-emitting stack 103 is then connected to the base 300 through the adhesive layer 301. Finally, the growth substrate is removed. In the embodiment, the first semiconductor contact layer 102 has a roughened lower surface, and the lower surface is connected to the adhesive layer 301. The upper surface of the base 300 includes a first region 300a and a second region 300b. As shown in FIG. 3, the first semiconductor contact layer 102 is formed on the first region 300a, and the second region 300b does not covered by the first semiconductor contact layer 102. The second region 300b may surround the first region 300a. The base 300 has a twelfth width s12 larger than an eleventh width s11 of the first semiconductor contact layer 102. The electrically insulating layer 107 covers on the second region 300b. In an embodiment, the base 300 includes a material that is transparent to the light emitted by the semiconductor active layer 103b, and the material may be an insulating material, such as sapphire or glass. In an embodiment, the adhesive layer 301 includes a material that is transparent to the light emitted by the semiconductor active layer 103b, and the material may be an insulating material, such as tantalum oxide ($TaO_x$), aluminum oxide ($AlO_x$), silicon oxide ($SiO_x$), titanium oxide ($TiO_x$), silicon nitride ($SiN_x$) or a polymer. In an embodiment, the adhesive layer 301 and the electrically insulating layer 107 include the same material, such as silicon dioxide ($SiO_x$) or aluminum oxide ($AlO_x$). In an embodiment, the electrically insulating layer 107 may cover the second region 300b of the base 300 and physically contact the adhesive layer 301. In addition, the semiconductor light-emitting device 30 may further include the first metal intermediate layer 105a and the second metal intermediate layer 106a as the semiconductor light-emitting device 20 does. In an embodiment, the semiconductor light-emitting stack 103 in the semiconductor light-emitting device 30 may have an outer side wall physically connected to an outer side wall of the first semiconductor contact layer 102. For the positions, materials, and related descriptions of other layers or structures, the foregoing embodiments can be referred to and are not repeatedly described herein.

Figure 4:
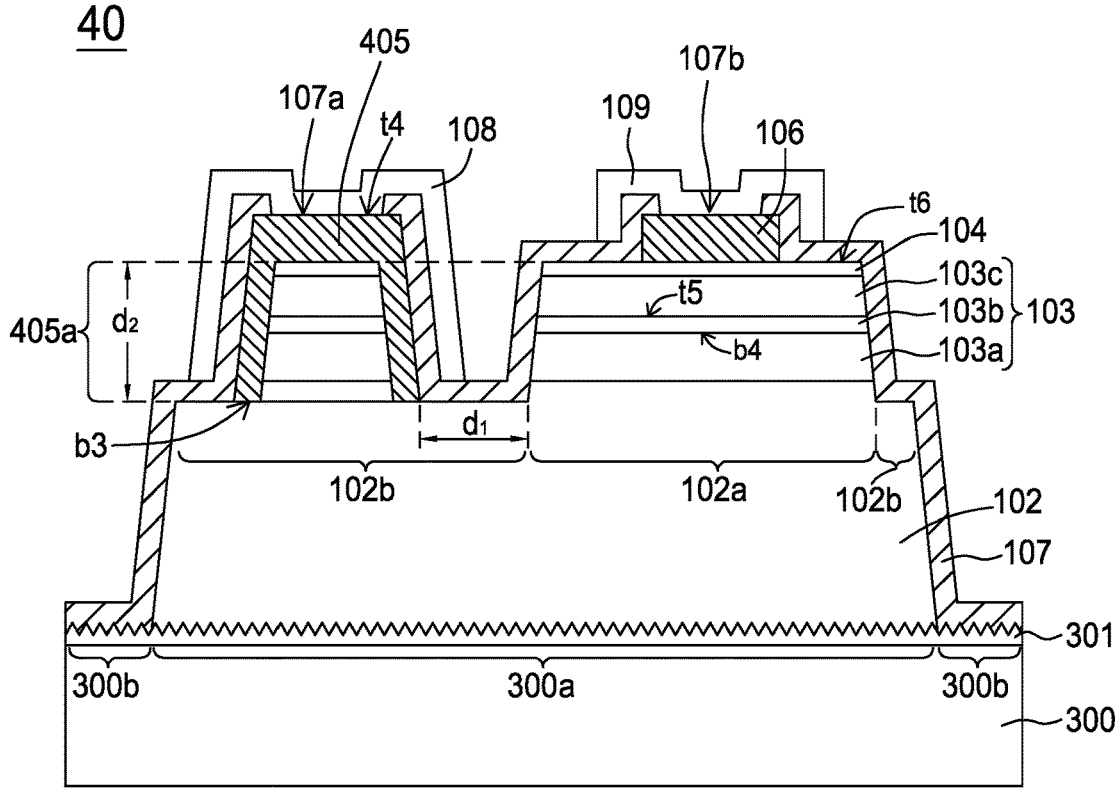
FIG. 4 shows a schematic sectional view of a semiconductor light-emitting device in accordance with an embodiment of the present disclosure.

FIG. 4 shows a schematic sectional view of a semiconductor light-emitting device 40 in accordance with an embodiment of the present disclosure. The semiconductor light-emitting device 40 includes a base 300, an adhesive layer 301, a first semiconductor contact layer 102, a semiconductor light-emitting stack 103, a second semiconductor contact layer 104, a semiconductor intermediate structure 405a, a first-conductivity-type contact structure 405, a second-conductivity-type contact structure 106, an electrically insulating layer 107, a first electrode pad 108, and a second electrode pad 109. The semiconductor light-emitting device 40 is mostly the same as the semiconductor light-emitting device 30, wherein elements indicated with same numerals or names are elements having same characteristics or properties, such as material composition or effect. Regarding specific descriptions for the elements, the foregoing embodiments can be referred to and are not repeatedly described herein.

The main difference between the semiconductor light-emitting device 40 and the semiconductor light-emitting device 30 is that semiconductor light-emitting device 40 further includes a semiconductor intermediate structure 405a. As shown in FIG. 4, the semiconductor intermediate structure 405a may be located between the first-conductivity-type contact structure 405 and the first semiconductor contact layer 102, and formed on and electrically connected to the first semiconductor contact layer 102. The first-conductivity-type contact structure 405 may be formed on and electrically connected to the semiconductor intermediate structure 405a. The electrically insulating layer 107 is formed on the base 300, the adhesive layer 301, the first semiconductor contact layer 102, semiconductor light-emitting stack 103, the second semiconductor contact layer 104, the semiconductor intermediate structure 405a, the first-conductivity-type contact structure 405, and the second-conductivity-type contact structure 106. As shown in FIG. 4, the semiconductor intermediate structure 405a includes the same laminated structure as the semiconductor light-emitting stack 103. The first-conductivity-type contact structure 405 completely covers the upper surface and the side surface of the semiconductor intermediate structure 405a and physically contacts the first semiconductor contact layer 102. The material of the first-conductivity-type contact structure 405 may be selected according to the material of the first semiconductor contact layer 102 so that the first-conductivity-type contact structure 405 can form a good electrical contact, such as an ohmic contact, with the first semiconductor contact layer 102. In an embodiment, first electrode pad 108 and the first-conductivity-type contact structure 405 include different material compositions. A third bottom surface b3 of the first-conductivity-type contact structure 405 is lower than a fourth bottom surface b4 of the semiconductor active layer 103b, and a fourth top surface t4 of the first-conductivity-type contact structure 405 is higher than a fifth top surface t5 of the semiconductor active layer 103b. In an embodiment, the fourth top surface t4 of the first-conductivity-type contact structure 405 is higher than a sixth top surface t6 of the second semiconductor contact layer 104. In an embodiment, a height difference between the first-conductivity-type contact structure 405 and the second-conductivity-type contact structure 106 is less than or equal to 10% of the height of the first-conductivity-type contact structure 405. For example, the height difference is between 0% and 10% (both included) of the height of the first-conductivity-type contact structure 405. The height mentioned above is defined by a vertical distance from the upper surface of the base 100 to an upper surface of the structure (e.g. the first-conductivity-type contact structure 405). In an embodiment, the first-conductivity-type contact structure 405 and the second-conductivity-type contact structure 106 physically contact the first semiconductor contact layer 102 and the second semiconductor contact layer 104, respectively. The first-conductivity-type contact structure 405 is separated from the semiconductor light-emitting stack 103 with a horizontal distance $d_1$. In an embodiment, the horizontal distance $d_1$ is not less than 1 µm. For example, the horizontal distance $d_1$ is between 3 µm and 10 µm (both included). In an embodiment, an extension line extending from a contact surface between the first-conductivity-type contact structure 405 and the first semiconductor contact layer 102 to an extension line extending from a contact surface between the second-conductivity-type contact structure 106 and the second semiconductor contact layer 104 has a vertical distance d2 less than or equal to 10 µm. For example, the vertical distance d2 is between 3 µm and 8 µm (both included). In an embodiment, the vertical distance d2 is between 4.5 µm and 6 µm (both included).

Figure 5A:
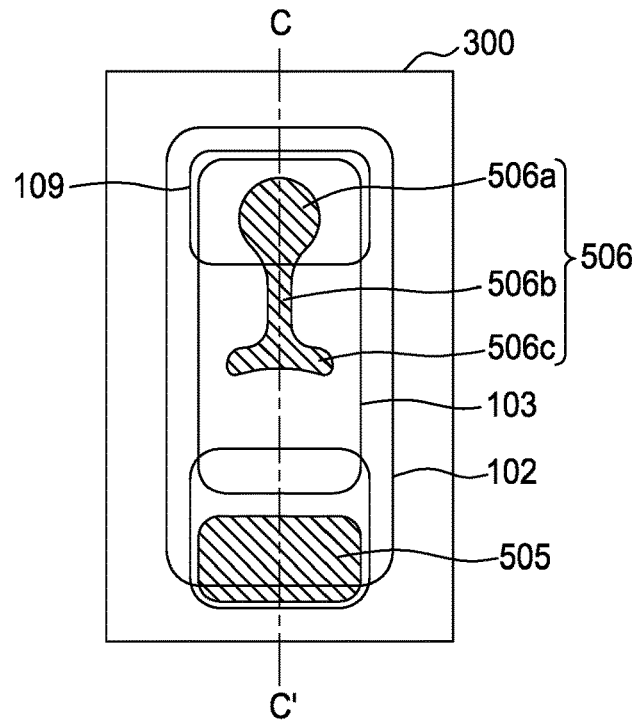
FIGS. 5A to 5D respectively show schematic sectional views of a semiconductor light-emitting device in accordance with an embodiment of the present disclosure.
Figure 5B:
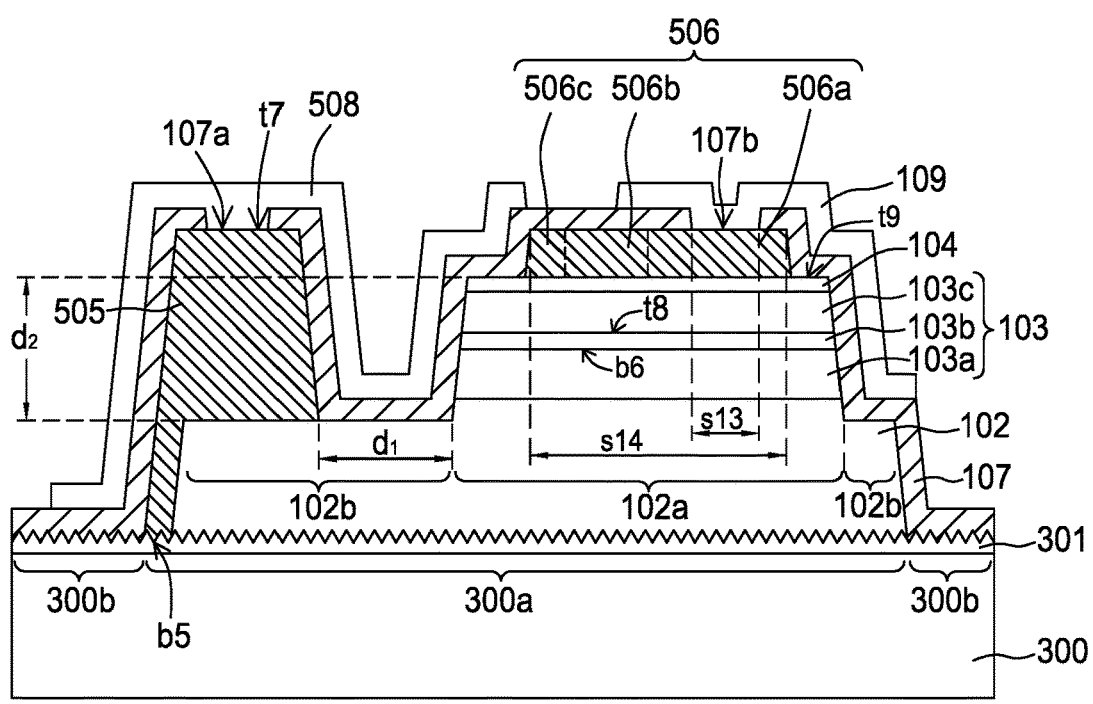

FIG. 5A shows a schematic top view of a semiconductor light-emitting device 50 in accordance with an embodiment of the present disclosure, and FIG. 5B shows a schematic sectional view along C-C' line in FIG. 5A. The semiconductor light-emitting device 50 includes a base 300, an adhesive layer 301, a first semiconductor contact layer 102, a semiconductor light-emitting stack 103, a second semiconductor contact layer 104, a first-conductivity-type contact structure 505, a second-conductivity-type contact structure 506, an electrically insulating layer 107, a first electrode pad 508 and a second electrode pad 109. The semiconductor light-emitting device 50 is mostly the same as the semiconductor light-emitting device 30, wherein elements indicated with same numerals or names are elements having same characteristics or properties, such as material composition or effect. Regarding specific descriptions for the elements, the foregoing embodiments can be referred to and are not repeatedly described herein.

As shown in FIGS. 5A and 5B, the main difference between the semiconductor light-emitting device 50 and the semiconductor light-emitting device 30 is that the first-conductivity-type contact structure 505 is formed in the fourth region 102b of the first semiconductor contact layer 102 and extends over a boundary of the first semiconductor contact layer 102 (that is, over the fourth region 102b). The first-conductivity-type contact structure 505 further covers a side surface of the first semiconductor contact layer 102 and connects the upper surface of the adhesive layer 301. In the embodiment, the first-conductivity-type contact structure 505 is a single layer. For example, material compositions of the first-conductivity-type contact structure 505 are uniformly distributed in the first-conductivity-type contact structure 505. In an embodiment, the first-conductivity-type contact structure 505 includes multiple layers. A fifth bottom surface b5 of the first-conductivity-type contact structure 505 is lower than a sixth bottom surface b6 of the semiconductor active layer 103b, and a seventh top surface t7 of the first-conductivity-type contact structure 505 is higher than an eighth top surface t8 of the semiconductor active layer 103b. In an embodiment, the seventh top surface t7 of the first-conductivity-type contact structure 505 is higher than the ninth top surface t9 of the second semiconductor contact layer 104. In an embodiment, a height difference between the first-conductivity-type contact structure 505 and the second-conductivity-type contact structure 506 is less than or equal to 10% of the height of the first-conductivity-type contact structure 505. For example, the height difference is between 0% and 10% (both included). The height mentioned above is defined by a vertical distance from the upper surface of the base 100 to an upper surface of the structure (e.g. the first-conductivity-type contact structure 505). In an embodiment, the first-conductivity-type contact structure 505 and the second-conductivity-type contact structure 506 physically contact the first semiconductor contact layer 102 and the second semiconductor contact layer 104, respectively. The first-conductivity-type contact structure 505 is separated from the semiconductor light-emitting stack 103 with a horizontal distance $d_1$. In an embodiment, the horizontal distance $d_1$ is not less than 1 µm. For example, the horizontal distance $d_1$ is between 3 µm and 10 µm (both included). In an embodiment, an extension line extending from a contact surface between the first-conductivity-type contact structure 505 and the first semiconductor contact layer 102 to an extension line extending from a contact surface between the second-conductivity-type contact structure 506 and the second semiconductor contact layer 104 has a vertical distance d2 less than or equal to 10 µm. For example, the vertical distance d2 is between 3 µm and 8 µm (both included). In an embodiment, the vertical distance d2 is between 4.5 µm and 6 µm (both included).

Another difference between the semiconductor light-emitting device 50 and the semiconductor light-emitting device 30 is that the second-conductivity-type contact structure 506 includes a bonding portion 506a, an extension portion 506c, and a connection portion 506b connected to the bonding portion 506a and the extension portion 506c. The bonding portion 506a may be directly located under the second opening 107b, such that the second electrode pad 109 can electrically connect the second-conductivity-type contact structure 506 through the second opening 107b. As shown in FIG. 5B, the second opening 107b has a thirteenth width s13 less than a fourteenth width s14 of the bonding portion 506a. As shown in FIG. 5A, the extension portion 506c extends from the bonding portion 506a towards the first-conductivity-type contact structure 505. In the top view of FIG. 5A, a projection region of the extension portion 506c on the base 300 is beyond a projection region of the second electrode pad 109 on the base 300. That is, the extension portion 506c is not located within the projection region of the projection region of the second electrode pad for further improving current spreading. Another difference between the semiconductor light-emitting device 50 and the semiconductor light-emitting device 30 is that the first electrode pad 508 extends over the semiconductor light-emitting stack 103 and covers a portion of the upper surface of the semiconductor light-emitting stack 103. In an embodiment, a height difference between the first electrode pad 508 and the second electrode pad 109 is less than or equal to 10% of the height of the first electrode pad 508. For example, the height difference is between 0% and 10% (both included) of the height of the first electrode pad 508. The height mentioned above is defined by a vertical distance from the upper surface of the base 300 to an upper surface of the structure (e.g. the first electrode pad 508). In an embodiment, the semiconductor light-emitting device 50 is a light-emitting diode (LED) chip.

Figure 5C:
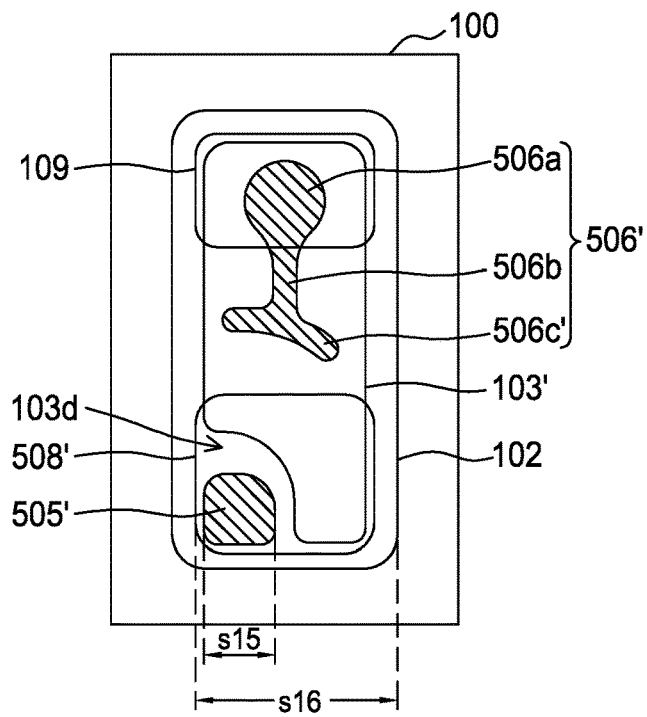

FIG. 5C shows a schematic top view of a semiconductor light-emitting device 50' in accordance with an embodiment of the present disclosure. The main difference between the semiconductor light-emitting device 50' and the semiconductor light-emitting device 50 is that in FIG. 5C a first-conductivity-type contact structure 505' is located at a corner of the semiconductor light-emitting device 50'. In the embodiment, the first-conductivity-type contact structure 505' has a fifteenth width s15 less than or equal to ½ of the sixteenth width s16 of the first electrode pad 508'. As shown in FIG. 5C, the semiconductor light-emitting stack 103' is separated from the first-conductivity-type contact structure 505' with a distance and has a recess portion 103d corresponding to the position of the first-conductivity-type contact structure 505'. As shown in FIG. 5C, edges of the recess portion 103d may have multiple rounded corners, and the rounded corners may have the same or different radii of curvature. In an embodiment, the direction in which the second-conductivity-type contact structure 506' extends is not parallel to each side of the semiconductor light-emitting device 50', and the extension portion 506c' faces the first-conductivity-type contact structure 505' in a top view. Specifically, as shown in the FIG. 5C, the second-conductivity-type contact structure 506' as a whole can have an asymmetrical shape either in the horizontal direction or the vertical direction. Another difference between the embodiments shown in FIG. 5C and FIG. 5A is that the first-conductivity-type contact structure 505' and the first electrode pad 508' in the FIG. 5C is completely located on the first semiconductor contact layer 102, and does not extend over the boundary of the first semiconductor contact layer 102.

Figure 5D:
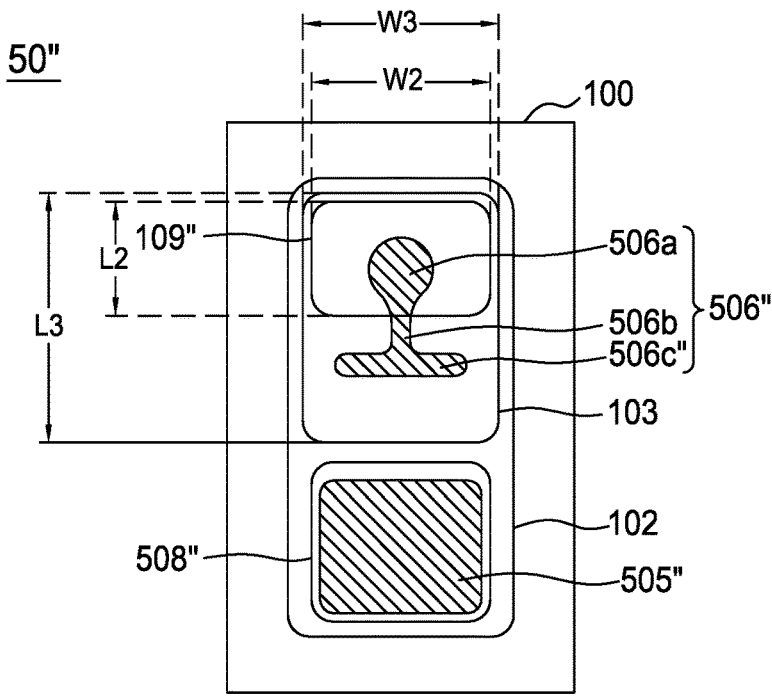

FIG. 5D shows a schematic top view of a semiconductor light-emitting device 50", which is a variation of the semiconductor light-emitting device 50 in accordance with an embodiment of the present disclosure. The main difference between the semiconductor light-emitting device 50" and the semiconductor light-emitting device 50 is that a first-conductivity-type contact structure 505" and a first electrode pad 508" is completely located on the first semiconductor contact layer 102 and does not extent over the semiconductor light-emitting stack 103. That is, both the first-conductivity-type contact structure 505" and the first electrode pad 508" do not covered on the semiconductor light-emitting stack 103. In addition, a second electrode pad 109" is completely located on the semiconductor light-emitting stack 103, and both the length L2 and the width W2 of the second electrode pad 109" are respectively smaller than the length L3 and the width W3 of the semiconductor light-emitting stack 103.

Figure 6A:
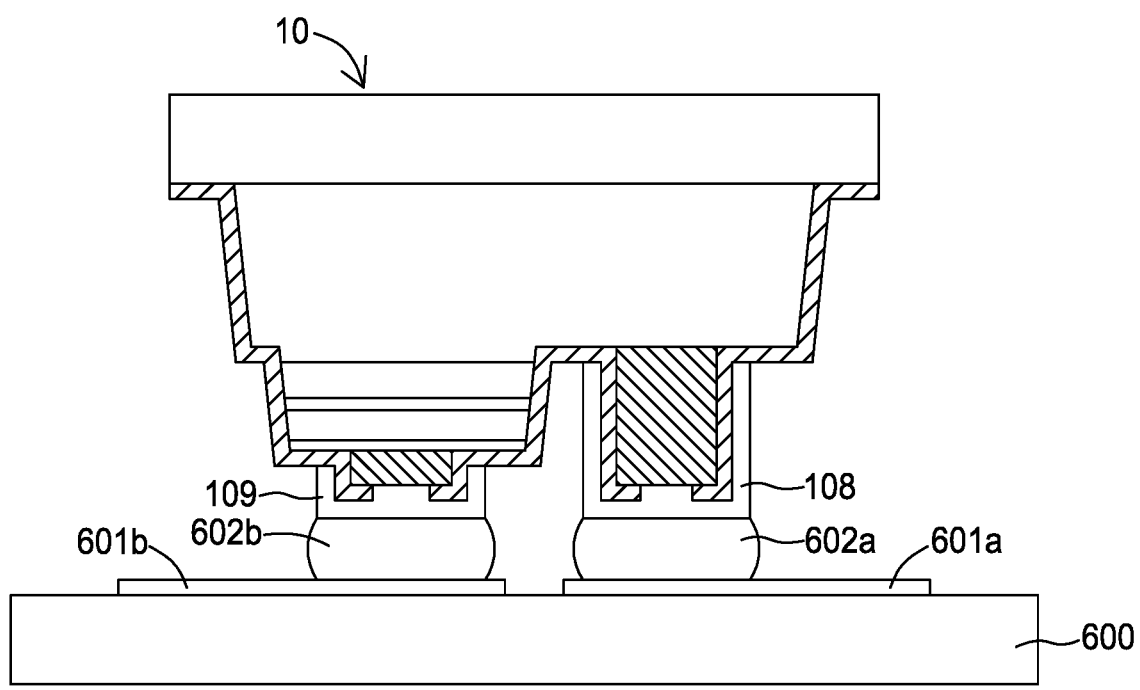
FIG. 6A shows a schematic sectional view of a semiconductor light-emitting component including a semiconductor light-emitting device connected to a carrier in accordance with an embodiment of the present disclosure.

FIG. 6A shows a schematic sectional view of a semiconductor light-emitting component 1000 including a semiconductor light-emitting device connected to a carrier 600 by flip-chip bonding in accordance with an embodiment of the present disclosure. The semiconductor light-emitting component 1000 includes a semiconductor light-emitting device selected from the above embodiments (such as the semiconductor light-emitting device 10, 20, 30, 40, 50, 50', 50" or any variation thereof). In the embodiment, the semiconductor light-emitting device 10 is illustrated as an example. As shown in FIG. 6A, the semiconductor light-emitting device 10 includes the first electrode pad 108 and the second electrode pad 109. The carrier 600 includes a third electrode pad 601a and a fourth electrode pad 601b. The first bonding layer 602a joins the first electrode pad 108 of the semiconductor light-emitting device 10 to the third electrode pad 601a of the carrier 600. The second bonding layer 602b joins the second electrode pad 109 of the semiconductor light-emitting device 10 to the fourth electrode pad 601b of the carrier 600. The carrier 600 may be a package submount or a printed circuit board (PCB), for example. The third electrode pad 601a and the fourth electrode pad 601b may respectively a single layer or have multiple layers. In an embodiment, the third electrode pad 601a and the fourth electrode pad 601b respectively include one or more material selected from nickel (Ni), titanium (Ti), platinum (Pt), palladium (Pd), silver (Ag), gold (Au), aluminum (Al) and copper (Cu). The first bonding layer 602a and the second bonding layer 602b may include metal. For example, the first bonding layer 602a and the second bonding layer 602b may include solder.

Figure 6B:
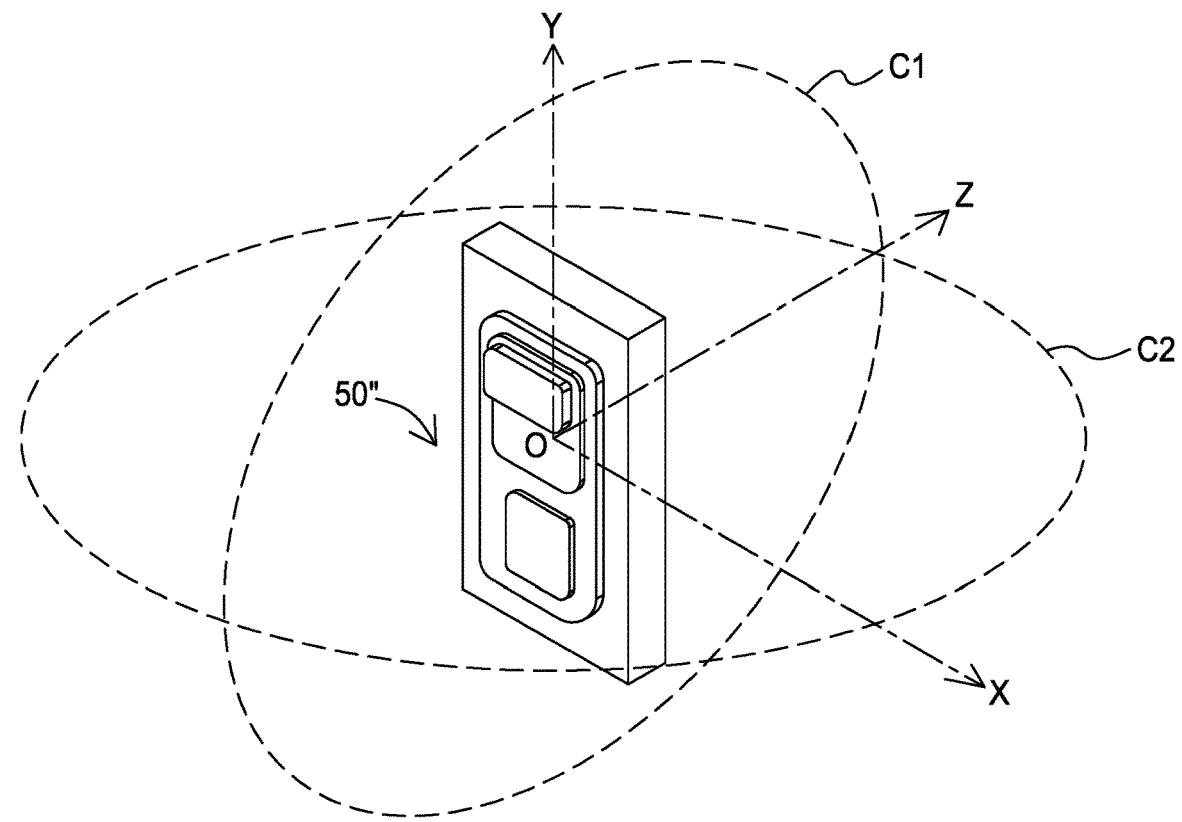
FIG. 6B shows a luminous intensity distribution curve measured during operation of a semiconductor light-emitting component including a semiconductor light-emitting device connected to a carrier in accordance with an embodiment of the present disclosure.
Figure 6B:
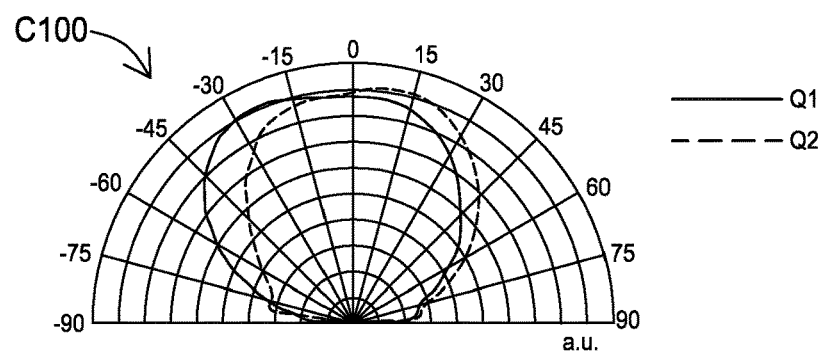
Figure 6B:
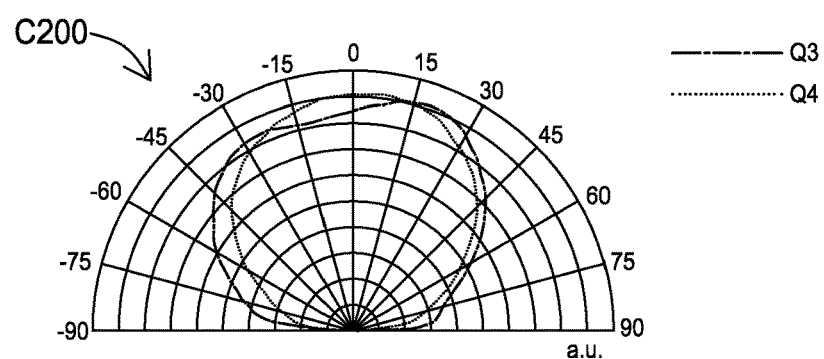

FIG. 6B shows a luminous intensity distribution curve measured during operation of a semiconductor light-emitting component including a semiconductor light-emitting device connected to a carrier by flip-chip bonding in accordance with an embodiment of the present disclosure. A schematic view for explaining the measuring method is also provided in the FIG. 6B.

As shown in the upper part of the FIG. 6B, the semiconductor light-emitting device 50" is illustrated in the embodiment as an example. For easily understanding the orientations in the measurement, only the outer profiles of the base 100, the first semiconductor contact layer 102, the semiconductor light-emitting stack 103, the first electrode pad 508" and the second electrode pad 109" of the semiconductor light-emitting device 50" are illustrated in FIG. 6B. A Goniophotometer is used to measure the luminous intensity of each point on a half-circle of a virtual circle when the semiconductor light emitting device 50" emits light, so that a light distribution curve can be obtained. The light distribution graph C100 shown in the upper part of FIG. 6B is obtained by conducting measurements on a virtual circle C1 on the YZ plane, and the light distribution graph C200 is obtained by conducting measurements on a virtual circle C2 on the XZ plane. The point O is, for example, corresponding to the geometric center of the base 100 of the semiconductor light-emitting element 50". The light distribution graphs C100 and C200 are respectively obtained by measuring and recording the angle and the luminous intensity corresponding to each point on the half circumference of the virtual circles C1 and C2, wherein the luminous intensity is indicated in arbitrary units (a.u.). Since the semiconductor light-emitting device is bonded to the carrier by flip chip bonding, the −90° and 90° positions (which are indicated as 90 and −90 in the upper part of FIG. 6B) in the light distribution graph C100 are located on the Y axis (+Y and −Y directions), the 0° position (which are indicated as 0 in the upper part of FIG. 6B) is located on the Z axis (+Z direction), the −90° and 90° positions in the light distribution graph C200 are both located on the X axis (+X and −X directions), and the 0° position is located on the Z axis (+Z direction). That is, the light distribution graphs C100 and C200 mainly indicate changes in luminous intensity at different angular positions on a side of the base 100 (i.e. the back side of the semiconductor light-emitting device). In addition, curves Q1 and Q3 in the light distribution graphs C100 and C200 both represent light distribution curves of semiconductor light-emitting devices in a bare chip form and connected to the carrier by flip-chip bonding, and curves Q2 and Q4 both represent light distribution curves of the semiconductor light-emitting devices connected to the carrier by flip-chip bonding wherein the front side of the semiconductor light-emitting devices are further covered by a colloidal material (not shown) after the semiconductor light-emitting devices are bonded to the carrier in a bare chip form. Specifically, the front side of the semiconductor light-emitting device refers to the side where the electrode pads are disposed. In the embodiment, the colloidal material completely covers the semiconductor light-emitting device 50" and protrudes towards the −Z direction. The colloidal material may include epoxy or silicone.

As shown in FIG. 6B, the maximum luminous intensity on the curve Q1 is attained at an angle between −30° and −15°, the maximum luminous intensity on the curve Q2 is attained at an angle between 0° and 15°, the maximum luminous intensity on the curve Q3 is attained at an angle between 15° and 30°, and the maximum luminous intensity on the curve Q4 is attained at an angle between 0° and 15°. Based on the results, it can be known that the semiconductor light-emitting device in the embodiment can have a maximum luminous intensity near the Z-axis on the back side (+Z direction) after the flip-chip bonding and being covered with the colloid material.

In addition, in this embodiment, the top-view area of the semiconductor light emitting stack 103 in the semiconductor light emitting device 50" occupies about 60% to 75% of the top-view area of the first semiconductor contact layer 102, and the semiconductor light-emitting stack 103 is arranged on one side of the first semiconductor contact layer 102 and the shape of the semiconductor light-emitting stack 103 is asymmetrical with respect to the X-axis. However, according to the curves Q2 and Q4 shown in FIG. 6B, the semiconductor light emitting device 50" can still have an almost symmetrical and smooth light distribution curve after the flip-chip bonding and being covered with the colloid material in a main range of light-emitting angles (for example, in a range between −60° and 60°).

Figure 6C:
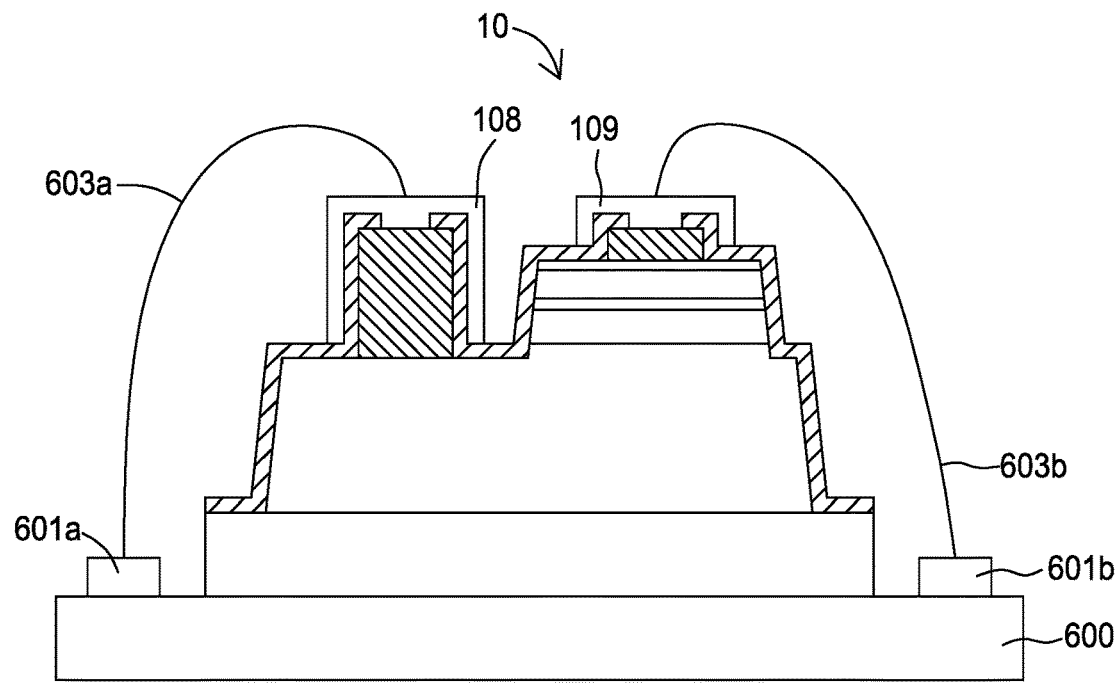
FIG. 6C to FIG. 6D respectively show schematic sectional views of the semiconductor light-emitting component in accordance with an embodiment of the present disclosure.

FIG. 6C shows a schematic sectional view of a semiconductor light-emitting component 2000 which includes a semiconductor light-emitting device connected to a carrier 600 through wire bonding in accordance with an embodiment of the present disclosure. The semiconductor light-emitting component 2000 may include a semiconductor light-emitting device as mentioned in the foregoing embodiments. In this embodiment, the semiconductor light emitting device 10 is illustrated in the embodiment as an example. As shown in FIG. 6C, the semiconductor light-emitting device 10 includes a first electrode pad 108, a second electrode pad 109, and the carrier 600 includes a third electrode pad 601a and a fourth electrode pad 601b. A first conducting wire 603a bonds the first electrode pad 108 of the semiconductor light-emitting device 10 to the third electrode pad 601a of the carrier 600, and a second conducting wire 603b bonds the second electrode pad 109 of the semiconductor light-emitting device 10 to the fourth electrode pad 601b of the carrier 600. The carrier 600 may be a package submount or a printed circuit board (PCB). The third electrode pad 601a and the fourth electrode pad 601b may respectively be a single layer or have multiple layers. In an embodiment, the third electrode pad 601a and the fourth electrode pad 601b respectively include one or more material selected from nickel (Ni), titanium (Ti), platinum (Pt), palladium (Pd), silver (Ag), gold (Au), aluminum (Al) and copper (Cu). In an embodiment, the first conducting wire 603a and the second conducting wire 603b respectively includes gold (Au) or copper (Cu).

Figure 6D:
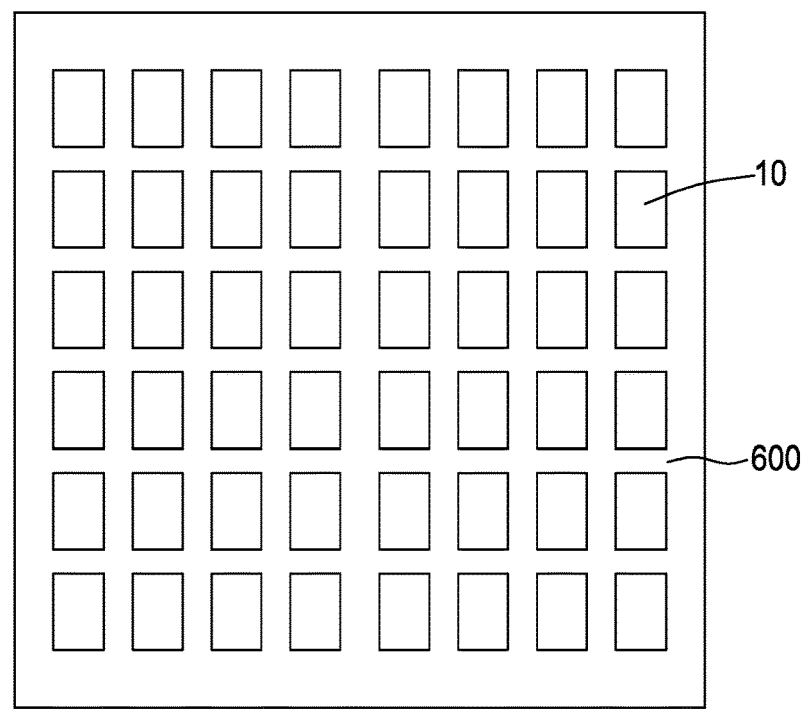

FIG. 6D shows a schematic top view of a semiconductor light-emitting component 3000 including a plurality of semiconductor light-emitting devices bonded to the carrier 600 in accordance with an embodiment of the present disclosure.

The semiconductor light-emitting component 3000 may include a plurality of semiconductor light-emitting devices each selected from the above embodiments (such as the semiconductor light-emitting device 10, 20, 30, 40, 50, 50', 50" or any variation thereof). In the embodiment, the semiconductor light-emitting devices 10 are indicated in the embodiment as an example. In the embodiment, the semiconductor light-emitting component 3000 includes a carrier 600 located under the plurality of the semiconductor light-emitting devices 10. The plurality of the semiconductor light-emitting devices 10 can be bonded to the carrier 600 through flip-chip bonding (as shown in FIG. 6A) or wire bonding (as shown in FIG. 6C). The plurality of semiconductor light emitting devices 10 are arranged in a two-dimensional matrix on the carrier 600. In an embodiment, the semiconductor light-emitting component 3000 may include semiconductor light-emitting devices emitting lights with different colors or emission wavelengths. For example, red semiconductor light emitting devices, green semiconductor light emitting devices, and blue semiconductor light emitting devices can be sequentially arranged in a two-dimensional matrix on the carrier 600. The dominant wavelengths or peak wavelengths of the red, green and blue semiconductor light emitting devices can be respectively in ranges of 600 nm to 660 nm, 515 nm to 575 nm, and 430 nm to 490 nm. In an embodiment, the semiconductor light-emitting component 3000 mainly emits a white light for an application in a backlight module of the display. In another embodiment, the plurality of semiconductor light emitting devices 10 in the semiconductor light-emitting component 3000 are arranged to form RGB pixels, wherein each pixel includes one or more red semiconductor light-emitting device, one or more green semiconductor light-emitting device, and one or more blue semiconductor light-emitting device for directly forming a display panel of the display. In another embodiment, the semiconductor light-emitting devices in the semiconductor light-emitting component 3000 include semiconductor light-emitting devices emitting lights with the same color or emission wavelength range. For example, all the semiconductor light-emitting devices are red semiconductor light-emitting devices, green semiconductor light-emitting devices, or blue semiconductor light-emitting devices. In an embodiment, the ratios of the top-view area of the semiconductor light emitting stack 103 to the top-view area of the first semiconductor contact layer 102 in the semiconductor light emitting devices of the semiconductor light emitting component 3000 may be different or the same. In an embodiment, the semiconductor light-emitting component 3000 includes red semiconductor light-emitting devices, green semiconductor light-emitting devices and the blue semiconductor light-emitting devices at the same time, and the above-mentioned top-view area ratio of each red semiconductor light-emitting device is smaller than that of each green semiconductor light-emitting device or that of each blue semiconductor light-emitting device.

Based on some embodiments, in the semiconductor light-emitting device of the present disclosure, the height difference between the first-conductivity-type contact structure and the second-conductivity-type contact structure is not greater than 10% of the height of first-conductivity-type contact structure and/or the height difference between the first electrode pad and the second electrode pad is not greater than 10% of the height of the first electrode pad, such that the yield rate of the semiconductor light-emitting device can be further improved in a subsequent process (such as packaging or die-bonding onto a package carrier) compared to a semiconductor light-emitting device in which the height difference between the electrode pads are relatively large. In addition, when the semiconductor light-emitting device of the present disclosure is used in a flip-chip bonding form, the tilt of the die after flip-chip bonding and any unwanted change in a light-emitting characteristic (such as light field or light emission angle) which result from the relatively large height difference of the electrode pads can be reduced.

Further, the semiconductor light-emitting device of the present disclosure can have a small size and can be incorporated in a display. Usually a semiconductor light-emitting device with a small size (for example, a micro-LED chip) may have an insufficient strength in a shear/pull test between the electrode pad of the semiconductor light-emitting device and a carrier for a subsequent process such as the process of bonding the semiconductor light-emitting device onto a package carrier; however, adopting the semiconductor light-emitting device that fulfills the following condition(s) may improve the result of the shear/pull test for a subsequent process such as soldering: (i) the height difference between the first-conductivity-type contact structure and the second-conductivity-type contact structure is not greater than 10% of the height of first-conductivity-type contact structure; and/or (ii) the height difference between the first electrode pad and the second electrode pad is not greater than 10% of the height of the first-conductivity-type contact structure; and/or (iii) an extension line extending from a contact surface between the first-conductivity-type contact structure and the first semiconductor contact layer to an extension line extending from a contact surface between the second-conductivity-type contact structure and the second semiconductor contact layer has a vertical distance $d_2$ less than or equal to 10 μm (For example, the vertical distance $d_2$ is between 3 μm and 8 μm (both included) or between 4.5 μm and 6 μm (both included)).

The semiconductor device of the present disclosure can be applied to products in various fields, such as illumination, medical care, display, communication, sensing, or power supply system. For example, the semiconductor device can be used in a light fixture, monitor, mobile phone, or tablet, an automotive instrument panel, a television, computer, wearable device (such as watch, bracelet or necklace), traffic sign, outdoor display device, or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:
1. A semiconductor light-emitting device, comprising:
a first semiconductor contact layer having a first upper surface comprising a first region and a second region;
a semiconductor light-emitting stack located on the first region and not located on the second region, and comprising an active layer;
a first-conductivity-type contact structure located on the second region and electrically connected to the first semiconductor contact layer;
a second semiconductor contact layer located on the semiconductor light-emitting stack;
a second-conductivity-type contact structure located on the semiconductor light-emitting stack and electrically connected to the second semiconductor contact layer; and
a first electrode pad located on and electrically connected to the first-conductivity-type contact structure;
wherein the first-conductivity-type contact structure has a first side surface, a first bottom surface and a first top surface, and the active layer has a second bottom surface and a second top surface, and the first bottom surface is lower than the second bottom surface, and the first top surface is higher than the second top surface in a cross-sectional view of the semiconductor light-emitting device,
wherein the first electrode pad has a first width, the first-conductivity-type contact structure has a second width less than the first width, and the first electrode pad covers the first side surface, and wherein the first-conductivity-type contact structure has a first top-view area, the first electrode pad has a second top-view area greater than the first top-view area.

2. The semiconductor light-emitting device of claim 1, further comprising a second electrode pad located on and electrically connected to the second-conductivity-type contact structure.

3. The semiconductor light-emitting device of claim 1, wherein the second semiconductor contact layer has a third top surface and the first top surface is higher than the third top surface in the cross-sectional view of the semiconductor light-emitting device.

4. The semiconductor light-emitting device of claim 2, further comprising an electrically insulating layer having a first opening and a second opening, wherein the first-conductivity-type contact structure connects to the first electrode pad through the first opening and the second-conductivity-type contact structure connects to the second electrode pad through the second opening.

5. The semiconductor light-emitting device of claim 1, wherein the first-conductivity-type contact structure has a first height, the second-conductivity-type contact structure has a second height, and a height difference between the first height and the second height is less than or equal to 10% of the first height.

6. The semiconductor light-emitting device of claim 1, wherein the semiconductor light-emitting stack comprises a second side surface, the first semiconductor contact layer comprises a third bottom surface and a third side surface which is connected to the second side surface, a first acute angle is formed between a first extension line extending from the second side surface and the third bottom surface, a second acute angle is formed between the third side surface and the third bottom surface in the cross-sectional view of the semiconductor light-emitting device, and the second acute angle is larger than the first acute angle.

7. The semiconductor light-emitting device of claim 1, wherein the second region surrounds the first region in a top view of the semiconductor light-emitting device.

8. The semiconductor light-emitting device of claim 1, wherein the first-conductivity-type contact structure is separated from the semiconductor light-emitting stack, and wherein a horizontal distance between the first-conductivity-type contact structure and the semiconductor light-emitting stack is not less than 1 μm.

9. The semiconductor light-emitting device of claim 1, wherein the semiconductor light-emitting device has a length L1 and a width W1, and a ratio of the width W1 and the length L1 is between 0.2 and 0.8.

10. The semiconductor light-emitting device of claim 1, wherein the semiconductor light-emitting stack has a first top-view area, the first semiconductor contact layer has a second top-view area, the first top-view area occupies 40% or more and 90% or less of the second top-view area.

11. The semiconductor light-emitting device of claim 1, wherein the semiconductor light-emitting stack has a first contact surface between the first-conductivity-type contact structure and the first semiconductor contact layer and a second contact surface between the second-conductivity-type contact structure and the second semiconductor contact layer, and a vertical distance between the first contact surface and the second contact surface is less than or equal to 10 μm.

12. The semiconductor light-emitting device of claim 1, wherein the second semiconductor contact layer include a binary compound semiconductor or a ternary compound semiconductor.

13. The semiconductor light-emitting device of claim 1, further comprising a substrate under the first semiconductor contact layer, wherein the substrate has a second upper surface comprising a third region and a fourth region, and the first semiconductor contact layer is located on the third region and not located on the fourth region.

14. The semiconductor light-emitting device of claim 1, wherein the first first-conductivity-type contact structure has a first thickness and the first electrode pad has a second thickness smaller than the first thickness.

15. The semiconductor light-emitting device of claim 2, wherein the second electrode pad and the first electrode pad have the same area in a top view of the semiconductor light-emitting device.

16. The semiconductor light-emitting device of claim 1, wherein the semiconductor light-emitting device has a length L1 less than or equal to 150 μm and a width W1 less than or equal to 100 μm, and a ratio of the width W1 and the length L1 is between 0.2 and 0.8.

17. The semiconductor light-emitting device of claim 2, wherein the second-conductivity-type contact structure has a third top-view area, the second electrode pad has a fourth top-view area larger than the third top-view area.

18. The semiconductor light-emitting device of claim 2, wherein the second-conductivity-type contact structure has a fourth side surface, the second electrode pad covers the fourth side surface.

19. The semiconductor light-emitting device of claim 2, wherein the second electrode pad has a third width, the second-conductivity-type contact structure has a fourth width less than the third width.

20. The semiconductor light-emitting device of claim 4, wherein the first opening is not overlapped with the first side surface in a vertical direction.

* * * * *